(12) United States Patent
Wright et al.

(10) Patent No.: US 7,109,101 B1
(45) Date of Patent: Sep. 19, 2006

(54) CAPPING LAYER FOR REDUCING AMORPHOUS CARBON CONTAMINATION OF PHOTORESIST IN SEMICONDUCTOR DEVICE MANUFACTURE; AND PROCESS FOR MAKING SAME

(75) Inventors: Marilyn I. Wright, Sunnyvale, CA (US); Srikanteswara Dakshina-Murthy, Wappingers Falls, NY (US); Kurt H. Junker, Austin, TX (US); Kyle Patterson, Froges (FR)

(73) Assignees: AMD, Inc., Sunnyvale, CA (US); Motorola, Inc., Schaumberg, IL (US)

( * ) Notice: Subject to any disclaimer, the term of this patent is extended or adjusted under 35 U.S.C. 154(b) by 109 days.

(21) Appl. No.: 10/430,711

(22) Filed: May 6, 2003

(51) Int. Cl.
*H01L 21/3205* (2006.01)
*H01L 21/4763* (2006.01)
*H01L 23/58* (2006.01)
*H01L 29/76* (2006.01)
*H01L 29/788* (2006.01)

(52) U.S. Cl. .............. 438/585; 438/586; 438/587; 438/303; 438/624; 438/637; 257/640; 257/401; 257/315; 257/295

(58) Field of Classification Search ........ 438/585, 438/623, 637, 661, 770, 303, 586, 733, 636, 438/587, 624; 257/640, 641, 315, 295, E21.038
See application file for complete search history.

(56) References Cited

U.S. PATENT DOCUMENTS

| | | | |
|---|---|---|---|
| 5,977,600 A * | 11/1999 | Wristers et al. | 257/408 |
| 5,989,957 A * | 11/1999 | Ngo et al. | 438/257 |
| 6,100,559 A * | 8/2000 | Park | 257/315 |
| 6,103,456 A * | 8/2000 | Tobben et al. | 430/317 |
| 6,165,891 A | 12/2000 | Chooi et al. | |
| 6,174,797 B1 * | 1/2001 | Bao et al. | 438/624 |
| 6,255,717 B1 * | 7/2001 | Babcock et al. | 257/640 |
| 6,316,349 B1 * | 11/2001 | Kim et al. | 438/637 |
| 6,428,894 B1 * | 8/2002 | Babich et al. | 428/408 |
| 6,455,882 B1 * | 9/2002 | Nakura | 257/295 |
| 6,624,068 B1 * | 9/2003 | Thakar et al. | 438/654 |
| 6,664,177 B1 * | 12/2003 | Lin et al. | 438/624 |
| 6,673,684 B1 * | 1/2004 | Huang et al. | 438/299 |
| 6,690,091 B1 | 2/2004 | Chooi | |
| 6,753,247 B1 * | 6/2004 | Okoroanyanwu et al. | 438/623 |
| 6,825,114 B1 * | 11/2004 | Fisher et al. | 438/661 |
| 6,875,664 B1 * | 4/2005 | Huang et al. | 438/299 |
| 6,884,733 B1 * | 4/2005 | Dakshina-Murthy et al. | 438/717 |
| 6,894,342 B1 * | 5/2005 | Hui et al. | 257/317 |
| 6,989,332 B1 * | 1/2006 | Bell et al. | 438/719 |
| 2003/0176076 A1 * | 9/2003 | Jost et al. | 438/733 |

* cited by examiner

*Primary Examiner*—David Zarneke
*Assistant Examiner*—Igwe U. Anya
(74) *Attorney, Agent, or Firm*—Charles E. Graves

(57) ABSTRACT

In the fabrication of semiconductor devices using the PECVD process to deposit hardmask material such as amorphous carbon, structure and process are described for reducing migration of species from the amorphous carbon which can damage an overlying photoresist. In one embodiment useful to 248 nm and 193 nm photolithography exposure wavelengths, amorphous carbon is plasma-deposited on a substrate to pre-defined thickness and pre-defined optical properties. A SiON layer is combined with a silicon-rich oxide layer, a silicon-rich nitride layer or a TEOS layer to create a capping layer resistant to species-migration. Layers are formulated to pre-determined thicknesses, refractive indices and extinction coefficients. The capping stacks constitute an effective etch mask for the amorphous carbon; and the hardmask properties of the amorphous carbon are not compromised. The disclosure has immediate application to fabricating polysilicon gates.

15 Claims, 1 Drawing Sheet

Figure 1:
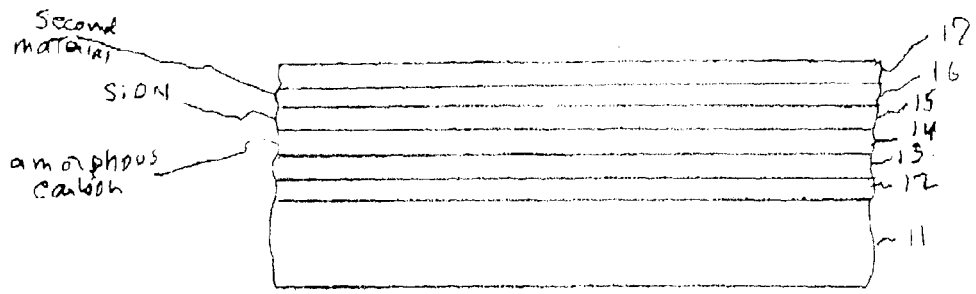

CAPPING LAYER FOR REDUCING AMORPHOUS CARBON CONTAMINATION OF PHOTORESIST IN SEMICONDUCTOR DEVICE MANUFACTURE; AND PROCESS FOR MAKING SAME

TECHNICAL FIELD

This invention relates to use of photoresist films in semiconductor device manufacturing; and more particularly to materials and processes for avoiding migration of species between the film and an amorphous carbon layer in the device.

BACKGROUND OF THE INVENTION

In the build-up of layers of a semiconductor device, features are lithographically defined by placing photoresist onto an underlying layer and selectively exposing the resist to a pre-selected wavelength of light. The exposure causes a photo-sensitive chemical reaction to occur in the photoresist, which creates patterns that determine features in underlying layers. Thereafter, the photoresist is developed, which removes unwanted areas and creates a desired feature pattern for the underlying layer. The patterned photoresist is then used as an etch mask to transfer the pattern into the underlying layer; or onto a hardmask atop the underlying layer that performs the pattern transfer.

The photoresist must be free of defects before etching commences. One mechanism that can degrade the integrity of a photoresist film is a chemical reaction between the film and an amorphous carbon layer that is sometimes formed between the substrate to be etched and the photoresist. Typically, the carbon layer serves as an etch hardmask useful in the fabrication of numerous devices such as, for example a MOSFET (Metal Oxide Semiconductor Field Effect Transistor) used in conventional CMOS (Complementary Metal Oxide Semiconductor) integrated circuits, or stacked-gate structures used in non-volatile memory devices for storing electrical charges. In one application the amorphous carbon hardmask material is formed over a gate electrode film. Photoresist film is deposited atop the hardmask layer; and a pattern is formed within the resist. The resist is developed to expose the hardmask material to the pattern. The hardmask is then etched, and the remaining photoresist is removed, leaving the hardmask material to serve as the mask to transfer the desired pattern to the gate electrode film by etch.

Amorphous carbon is an advantageous choice for hardmask material because of its etch resistant (low etch rate) properties when compared to the typical materials used for underlying gate stacks such as polysilicon. Other hardmask materials including silicon nitride film, oxide film, or a silicon oxynitride film may also be advantageous. The amorphous carbon typically is deposited using a PECVD process. If placed into direct contact with the photoresist film, amorphous carbon can poison the photoresist by allowing nitrogen species from the carbon layer to diffuse into the film and neutralize photogenerated acid species. The neutralization results in a failure to remove the resist in the desired region during the develop step which uses mild basic chemistry, thereby leading to the formation of a region of undesired resist—also known as an "extra pattern" of resist. Extra resist patterns are defects since the pattern on the photolithographic mask is not transferred to the wafer with perfect fidelity. The extra resist patterns can distort the shape of printed features, which can affect conductivity and adversely impact the feature's influence on underlying layers, as by affecting channel length, for example. If the extra patterns are sufficiently large—in the vicinity of 300 nm in diameter when the space between adjacent lines is only 200 nm, shorting can occur with resultant yield losses.

One way to avoid the defects of photoresist poisoning is to separate the resist and amorphous carbon layers with an intermediary or "capping" layer. These are typically formed by applying a layer of SiON between the resist film and the amorphous carbon layer. The SiON layer is about 200–400 Angstroms in thickness, and the amorphous carbon layer is >100 Angstroms in thickness, preferably in a range of 300–700 Angstroms. Capping layers formed only of SiON in the PECVD plasma environment, however, have a tendency to develop pinholes on the order of 10–20 nm in major (lateral) dimension. One explanation as to causation is poor step coverage or insufficient nucleation over the underlying film. The pinholes allow species such as nitrogen to migrate through and interact with photoresist, thereby causing extra pattern defects as described above.

A possible solution is an alternative intermediary material to the current SiON, which has less or preferably no inclination to form pinholes. Another possible solution is to create a "capping stack" consisting of multiple layers of different materials including SiON, to thwart pinhole formation.

Realizing a successful alternative capping layer or capping stack requires more than simply producing a non-porous barrier between the amorphous carbon and the resist layer. Meeting all of the following requirements is essential for an effective capping stack. The capping stack must be an effective etch masking layer for the amorphous carbon serving as a hardmask. Further, the amorphous carbon must retain its hardmask properties for the substrate layer beneath it, which can be polysilicon, a polymer, an oxide, or many other different materials such as SiCOH used in the back end of line/interconnect levels, bare silicon, or a nitride placed on bare silicon, or a metallic gate electrode such as TiN.

Moreover, material chosen for each of the layers in the capping stack must be formable with fairly precise optical properties including the real and imaginary components of refractive index, in order to assure that anti-reflection and CD swing minimization objectives are achieved. CD swing may be defined as the variation in printed dimension in the photoresist arising from differences in photoresist thickness caused by underlying topography. Interference effects due to back reflection from the underlying substrate can modulate the retained dose in the photoresist, thereby changing the printed dimension. A typical target is <0.5% reflectivity into the resist at the photolithography wavelength of choice which by current industry standards are 248 nm, or 193 nm; and (in the future) 157 nm. Finally, the capping stack layers should be producible in the existing PECVD process without having to materially alter the deposition chamber or remove the wafers from the chamber.

Complicating the containment of photoresist defects is the fact that the size of the extra patterns will impact different device technologies differently, depending on the physical layout and pitch. For example, an extra pattern 400 nm in width is unlikely to cause significant yield loss when the spacing between lines is, say, 500 nm. However, as device dimensions continue to shrink, the same defect can have a catastrophic yield impact when spacings are reduced to 300 nm. Also, in a given technology, features on circuits may have locations consisting of patterns with increased/decreased pattern density which may be affected differently due to similar reasons as above. Further, photoresist patterns used for contact and interconnect "via" definition—usually known as "dark field" masks owing to the reduced overall open area—may possibly be affected to a lesser extent than, say, a gate layer mask "bright field" for the same extent of defects likely to cause unintended patterns.

SUMMARY OF THE INVENTION

The invention in one specific application is a set of capping stack layers which fulfill the prerequisites stated above when using PECVD deposition in 193 nm. or 248 nm. photolithography regimes.

In one embodiment used in PECVD fabrication of a poly gate application, an amorphous carbon layer is plasma-deposited on a substrate to pre-defined thickness and pre-defined optical properties. The underlying polysilicon substrate thickness is 1000–2000 A. The polysilicon is deposited on underlying topography composed of gate dielectric and isolation regions. The poly gate may also have additional layers of silicon-germanium $Si_xGe_{1-x}$ wherein typically x=0.8. An intermediary layer, the capping stack, comprising plural separately deposited layers then is laid down on the amorphous carbon to prescribed thicknesses and prescribed optical properties. Atop this layering the photoresist film is placed.

The optical properties of primary interest to impart to the capping stack are: refractive index, denoted hereinafter "n"; and extinction coefficient, hereinafter "k". The complex refractive index is ñ=n+ik according to standard definitions. For optimal stacking layers according to the invention, these values will vary depending on the photolithographic wavelength used on the resist, on the materials chosen for the capping stack, and on the material thicknesses. In general, the optical properties of the capping layer are selected to minimize the overall reflectivity of the stack.

A capping stack for an amorphous carbon layer is realized in one embodiment by combining an SiON layer with one or more additional layers of a silicon-rich oxide. The desired thicknesses of the capping layer materials and of the amorphous carbon, are wavelength-specific. In one embodiment which is suitable for 248 nm. and 193 nm. photolithography exposure wavelengths, an SiON layer having a thickness of about 200 Angstroms, is combined with a silicon-rich oxide layer of about 150 Angstroms to create the capping stack atop the amorphous carbon layer. The silicon-rich oxide layer is formulated with an index of refraction value "n" of between 1.5 and 1.7; and a value "k" between 0 and about 0.15.

In a second embodiment suitable for 248 nm and 193 nm, a SiON layer having a thickness of about 200 Angstroms is combined with a silicon-rich nitride layer of about 50 to 200 Angstroms to create the capping stack. The n-value is held to within a range of from 2.45 to 2.7; and the k-value is held to a range of from 0.4 to 0.7.

In a third embodiment a capping stack consists of a SiON layer and TEOS.

The invention may be employed more broadly to, for example, masking of oxide, masking of SiCOH, masking of silicon for trench layers, or masking of metallic gates. In each case the required thicknesses of individual capping layers may be determined from reflectivity calculations using the Fresnel equations, once the optical properties of the individual layers are known. These calculations may be performed using commercially available photolithography modeling software such as PROLITH™ available from KLA-Tencor; and are well known to those skilled in the art.

DRAWING

Figure 2:
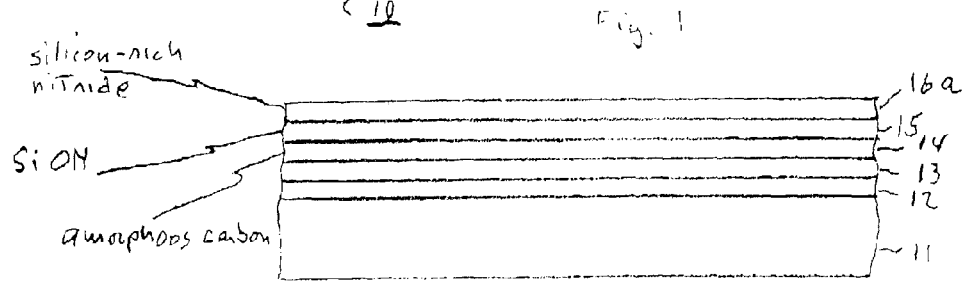
Figure 3:
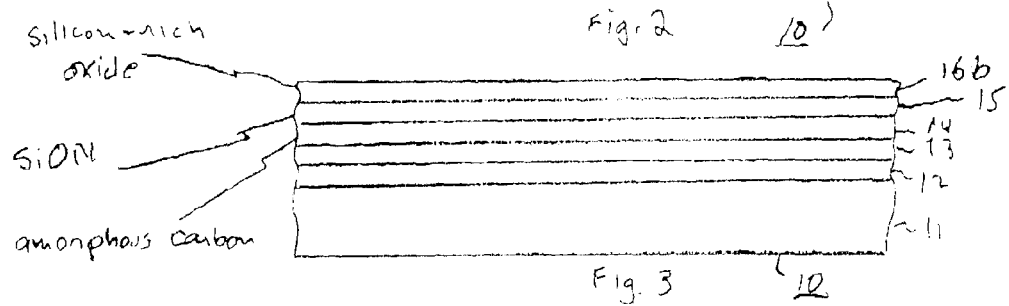
Figure 4:
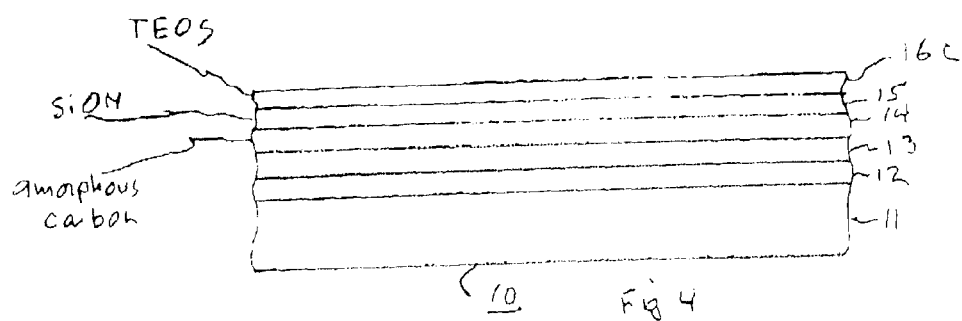

FIG. 1 is a schematic side view of part of a semiconductor wafer during fabrication, showing a generalized capping stack for an amorphous carbon layer; and FIGS. 2, 3 and 4 are schematic side views of different semiconductor wafers during fabrication, showing three different specific capping stack structures.

DETAILED DESCRIPTION OF ILLUSTRATIVE EMBODIMENTS

Capping stack structures are taught hereinafter which effectively block the intermingling of nitrogen and hydrogen with a resist layer in a polysilicon gate application, thus to avoid the problem of generating deleterious extra patterns. Importantly, the capping stacks provide an effective etch masking layer for amorphous carbon, do not interfere with the carbon providing a hardmask to the layer underlying the carbon, and are formed to precise needed optical properties using a PECVD process.

FIG. 1 shows a portion of a semiconductor wafer 10 at an intermediate stage of fabrication. Wafer 10 consists of an underlying substrate 11 which serves several well-known purposes in a polysilicon gate application, a gate oxide layer 12, and a polysilicon or gate conductive region 13. An amorphous carbon layer 14 is formed over region 13. Next, a layer 15 of SiON and at least one adjacent layer 16 of a second material are formed atop amorphous carbon layer 14, either in the sequence as shown in FIG. 1; or in reverse sequence where the second material layer 16 is formed on layer 14 and the SiON layer 15 is formed atop the layer 16. Layers 15 and 16 constitute a "capping stack". Atop the capping stack is placed photoresist 17.

Amorphous carbon layer 14 is formed using the PECVD process with an atmosphere of carbon gases. The amorphous carbon precursor can be methane ($CH_4$), ethane ($C_2H_6$), propylene ($C_3H_6$), and propane ($C_3H_8$). Deposition conditions are tool platform-dependent; but can be in the range of: temperature in the range of 350–650 deg. C., pressure in the range of 1–15 Torr; and plasma power in the range of 500 to 2000 W. Gas flows of 150–1000 sccm of the hydrocarbon, and 0–8 liter/min of He are maintained for deposition of undoped amorphous carbon. If nitrogen doping of the carbon is desired, then to produce a doping concentration of approximately 6 atomic percent nitrogen a flow ratio of approximately 1:10 of propylene to nitrogen gas is used (e.g., 300 cubic centimeters of propylene per minute to 3 liters of nitrogen per minute). The deposited amorphous carbon layer 14 may include between approximately 0 and 10 atomic percent nitrogen. Several examples of capping stack structures and processes for forming same follow.

Following are specific examples of capping stack structures and their fabrication. The elements 11, 12 13 and 14 are the same in FIGS. 2–4 as are described above for FIG. 1.

Example 1

In FIG. 2, a capping stack buildup consisting of SiON layer 15 and a second material comprising silicon-rich nitride layer 16a is formed on top of amorphous carbon layer 14. The SiON may be placed either on top of the silicon-rich nitride layer 16a or below it. Deposition of SiON is effected by flowing 3–6 liter/min $N_2$, 100–300 sccm $SiH_4$ gas, and 50–300 sccm $N_2O$ gas. The plasma is maintained at 350–500 degrees C. and at 3–8 Torr pressure. RF plasma power is maintained at between 250 and 500 Watts. With these conditions, typical deposition rates of SiON are 30–150 A/sec. These process parameters may be varied to achieve the desired control over the deposition thickness and optical properties. Specifically, the layer 15 of SiON suitable for 193 nm photoresist system is 200 nm in thickness and with optical values n=1.8±0.10 and k=0.3±0.05. These values are optimal because of the resulting low reflectivity leading to minimal CD swing and thereby better CD control and uniformity over the reticle and wafer, which leads to better yields and device performance. Following deposition of the SiON layer 15, a layer 16a of silicon-rich nitride is deposited using the same deposition conditions as for the SiON, except that the flow of $N_2O$ gas is reduced to the range of from 20 to 50 sccm. The silicon-rich oxide layer thickness advantageously is centered at around 150 Angstroms. All other conditions are held the same.

Example 2

In FIG. 3, a capping stack buildup consisting of SiON layer 15 and a second material comprising silicon-rich oxide layer 16b is formed on top of amorphous carbon layer 14. The SiON is deposited as in Example 1. To deposit silicon-rich oxide, $SiH_4$ gas is flowed at 50–300 sccm, $N_2$ gas is flowed at 1–2 liter/minute, and $N_2O$ gas is flowed at 100 cc–7 liters/minute. Pressure of 800 mT to 3 Torr, wafer temperature of 350–500 degrees C., and plasma power between 250–600 watts are maintained. As in Example 1 process parameters are varied to achieve desired control over the deposition thickness and optical properties. Thus layer 16b of silicon-rich oxide film suitable for the reflectivity requirements of a 193 nm photoresist process, is approximately 200 Angstroms thick, although thickness can vary between about 50 to 200 Angstroms. Layer 16b is produced with optical values of n=1.75±0.10 and k=0.2±0.2v. These are optimal because of the resulting low reflectivity leading to small CD swing and thereby better CD control and uniformity over the reticle and wafer, again leading to better yields and device performance.

Example 3

In FIG. 4, a capping stack buildup is realized consisting of an SiON 15 and a second material comprising TEOS oxide layer 16c (oxide deposited using Tetra Ethyl Ortho Silicate precursor). The SiON is deposited as in Example 1. Then, either above or below the SiON layer 15, the layer 16c of TEOS oxide is deposited. The deposition of TEOS oxide in the PECVD process is conventional using well-known TEOS precursors. Again, process parameters are varied to achieve desired control over the deposition thickness and optical properties. A layer of TEOS oxide film suitable for the 193 nm photoresist process is approximately 250 Angstroms thick, but may vary in thickness from about 150 to 300 Angstroms; and has values of n=1.67±0.07 and k=0.1±0.1v.

In summary, the capping stacks exemplified above enable the requisite low reflectance to be obtained in the layers below the photoresist, while keeping the amorphous carbon and the photoresist separated more effectively through the multiple depositions.

What is claimed is:

1. An etch mask structure formed over a device layer during fabrication of a semiconductor device, said etch mask structure comprising:
  a layer of amorphous carbon formed over said device layer;
  a capping stack formed over said amorphous carbon layer;
  and a photoresist film deposited over said capping stack;
    said capping stack comprising
      a deposition of SiON and
      a deposition adjacent to said SiON deposition of a second material selected to retard migration of species of nitrogen and hydrogen from said SiON deposition to said photoresist layer.

2. An etch mask structure according to claim 1, wherein said second material is silicon-rich nitride.

3. An etch mask structure according to claim 2, wherein
  said device layer is a polysilicon gate layer having a layer thickness of from 1000 Angstroms to 2000 Angstroms and
  said silicon-rich nitride has a refractive index in a range of from 1.7 to 1.9 and an extinction coefficient in a range of from 0.25 to 0.35.

4. An etch mask structure according to claim 1, wherein said second material is silicon-rich oxide.

5. An etch mask structure according to claim 4, wherein
  said device layer is a polysilicon gate layer having a layer thickness of from 1000 Angstroms to 2000 Angstroms and
  said silicon-rich oxide has a refractive index in a range of from 1.50 to 1.85 and an extinction coefficient in a range of from 0.0 to 0.2.

6. An etch mask structure according to claim 1, wherein said second material is TEOS.

7. An etch mask structure according to according to claim 6 wherein
  said device layer is a polysilicon gate layer having a layer thickness of from 1000 Angstroms to 2000 Angstroms and
  said TEOS has a refractive index in a range of from 1.60 to 1.74 and an extinction coefficient in a range of from 0.0 to 0.2.

8. An etch mask structure formed over a device layer during fabrication of a semiconductor device using PECVD deposition processes, said etch mask structure comprising:
  a layer of amorphous carbon formed over said device layer;
  a capping stack formed over said amorphous carbon layer;
  and a photoresist film deposited over said capping stack;
    said capping stack comprising
      a deposition of SiON and
      a deposition adjacent to said SiON deposition of a second material selected to retard migration of species of nitrogen and hydrogen from said SiON deposition to said photoresist layer.

9. For use during a semiconductor device fabrication process, an intermediate structure formed over a deposited amorphous carbon layer in said device to retard migration of species of nitrogen and hydrogen from said deposited layer to an overlaid photoresist layer, said intermediate structure comprising:
  a capping stack formed over said deposited layer and comprising
    a deposition of SiON and
    a deposition adjacent to said SiON deposition of a second material selected from the group consisting of silicon-rich nitride, silicon-rich oxide and TEOS.

10. In the fabrication of a semiconductor device comprising a device layer formed on a substrate, an interconnect layer providing circuit accesses to said device layer, and an amorphous carbon layer formed atop said interconnect layer, a method for retarding migration of species of nitrogen and hydrogen to a photoresist layer formed to pattern said interconnect layer, said method comprising forming a capping stack atop said amorphous carbon layer by depositing a layer of SiON over said device layer; and depositing adjacent to said SiON deposition a layer of a second material selected from the group consisting of silicon-rich nitride, silicon-rich oxide and TEOS.

11. The method of claim 10 wherein said second material is deposited beneath said layer of SiON.

12. The method of claim 10 wherein said second material is deposited atop said layer of SiON.

13. The method of claim 10 wherein said device layer is a polysilicon gate layer having a layer thickness of from 1000 Angstroms to 2000 Angstroms and the step of depositing said second material comprises depositing silicon-rich nitride and controlling deposition parameters to impart a refractive index in a range of from 1.7 to 1.9 and an extinction coefficient in a range of from 0.25 to 0.35.

14. The method of claim 10 wherein said device layer is a polysilicon gate layer having a layer thickness of from 1000 Angstroms to 2000 Angstroms and the step of depositing said second material comprises depositing silicon-rich oxide and controlling deposition parameters to impart a refractive index in a range of from 1.50 to 1.85 and an extinction coefficient in a range of from 0.0 to 0.2.

15. The method of claim 10 wherein said device layer is a polysilicon gate layer having a layer thickness of from 1000 Angstroms to 2000 Angstroms and the step of depositing said second material comprises depositing TEOS and controlling deposition parameters to impart a refractive index in a range of from 1.60 to 1.74 and an extinction coefficient in a range of from 0.0 to 0.2.

* * * * *